United States Patent
Inaba et al.

(10) Patent No.: US 8,129,804 B2
(45) Date of Patent: Mar. 6, 2012

(54) ELECTRONIC DEVICE, RESONATOR, OSCILLATOR AND METHOD FOR MANUFACTURING ELECTRONIC DEVICE

(75) Inventors: Shogo Inaba, Fujimi-machi (JP); Akira Sato, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/168,561

(22) Filed: Jun. 24, 2011

(65) Prior Publication Data
US 2011/0303457 A1 Dec. 15, 2011

Related U.S. Application Data

(63) Continuation of application No. 12/045,990, filed on Mar. 11, 2008, now Pat. No. 7,994,594.

(30) Foreign Application Priority Data

Mar. 15, 2007 (JP) .................... 2007-066339
Feb. 7, 2008 (JP) .................... 2008-027304

(51) Int. Cl.
  *H01L 29/84* (2006.01)
(52) U.S. Cl. ................. 257/416; 257/E31.001
(58) Field of Classification Search ............ 257/416, 257/E31.001
See application file for complete search history.

(56) References Cited

U.S. PATENT DOCUMENTS

| 6,787,387 | B2 | 9/2004 | Ikushima et al. |
| 7,129,163 | B2 | 10/2006 | Sherrer et al. |
| 7,329,056 | B2 | 2/2008 | Sherrer et al. |
| 2004/0032012 | A1 | 2/2004 | Wong et al. |
| 2006/0267109 | A1 | 11/2006 | Ohguro |
| 2007/0018761 | A1 | 1/2007 | Yamanaka et al. |
| 2007/0040268 | A1 | 2/2007 | Sherrer et al. |
| 2007/0072321 | A1 | 3/2007 | Sherrer et al. |
| 2007/0164419 | A1 | 7/2007 | Sherrer et al. |
| 2008/0067655 | A1 | 3/2008 | Gillot et al. |

FOREIGN PATENT DOCUMENTS

| JP | A-2005-24480 | 1/2005 |
| JP | A-2005-123561 | 5/2005 |
| JP | A-2005-136384 | 5/2005 |
| JP | A-2005-297180 | 10/2005 |
| JP | A-2006-88268 | 4/2006 |
| JP | A-2006-147995 | 6/2006 |
| JP | A-2006-263902 | 10/2006 |
| JP | A-2007-035290 | 2/2007 |
| JP | A-2007-222956 | 9/2007 |
| WO | WO 2005-031861 A1 | 4/2005 |

*Primary Examiner* — Jenny L Wagner
(74) *Attorney, Agent, or Firm* — Oliff & Berridge, PLC

(57) ABSTRACT

An electronic device includes a substrate, a functional structural body formed on the substrate and a covering structure for defining a cavity part having the functional structural body disposed therein, wherein the covering structure is provided with a side wall provided on the substrate and comprising an interlayer insulating layer surrounding the cavity part and a wiring layer; a first covering layer covering an upper portion of the cavity part and having an opening penetrating through the cavity part and composed of a laminated structure including a corrosion-resistant layer; and a second covering layer for closing the opening.

12 Claims, 7 Drawing Sheets

ELECTRONIC DEVICE, RESONATOR, OSCILLATOR AND METHOD FOR MANUFACTURING ELECTRONIC DEVICE

This is a Continuation of application Ser. No. 12/045,990 filed Mar. 11, 2008, which claims the benefit of Japan 2007-066339 filed Mar. 15, 2007 and Japan 2008-027304 filed Feb. 7, 2008.

BACKGROUND

1. Technical Field

The present invention relates to a structure of each of an electronic device, a resonator and an oscillator having a functional structural body such as MEMS (micro electro mechanical systems) disposed in a cavity part configured on a substrate and to a method for manufacturing an electronic device.

2. Related Art

In general, an electronic device having a functional structural body such as MEMS disposed in a cavity part is known. MEMS, for example, micro oscillators, micro sensors and micro actuators, are accommodated in a cavity part in a movable state because a micro structural body is required to be disposed in a state such that oscillation, deformation or other movement is possible (see, for example, JP-A-2005-297180 and JP-A-2005-123561).

Now, as disclosed in JP-A-2005-297180, a method in which after forming a micro functional structural body on a surface of a one-sided substrate, the one-sided substrate is joined with the other-sided substrate in a vacuum chamber via an O-ring, and thereafter, a sealer is filled in the outside of the O-ring is known as a method for forming the foregoing cavity.

Also, as disclosed in JP-A-2005-123561, a method in which after forming an MEMS structural body on a substrate and forming a sacrifice layer thereon, a first sealing member having a through-hole is formed, the sacrifice layer is removed through the through-hole of this first sealing member to release a movable part of the MEMS structural body, and finally, the through-hole of the first sealing member is covered by a second sealing member to achieve closing is known as other method.

Also, a method similar to those in JP-A-2005-297180 and JP-A-2005-123561, in which in a structure having a complementary metal oxide semiconductor (CMOS) and an MEMS structural body monolithically configured therein, a cavity part is formed at the same time by employing a wiring forming technology of MOSFET, is described (see, for example, JP-A-2006-263902).

However, the method of sticking two substrates as described in JP-A-2005-297180 involves a problem that since a substrate for exclusive use is necessary, material costs increase, and even if it is intended to form a micro mechanical device by employing a general semiconductor manufacturing technology, since a special process for sticking the substrates to each other is necessary, advantages to be brought by employing the semiconductor manufacturing technology are reduced, and the manufacturing costs increase.

Also, the method of using a first sealing member having a through-hole and a second sealing member for closing the through-hole as disclosed in JP-A-2005-123561 involves a problem that since the release process of the MEMS structural body is carried out through the through-hole of the first sealing member, it takes a long period of time for achieving etching so that the first sealing member must be formed of a raw material capable of thoroughly withstanding the etching of the release process, and as a result, the first sealing member cannot be formed in a common process to the semiconductor manufacturing process, leading to an increase of the manufacturing costs.

The structure having a complementary metal oxide semiconductor (CMOS) and an MEMS structural body monolithically configured therein also involves the same problems as those described above.

SUMMARY

An advantage of some aspects of the invention is to provide a structure of each of an electronic device, a resonator and an oscillator capable of efficiently carrying out a manufacturing process of an electronic device comprising a functional structural body disposed in a cavity on a substrate and an electronic circuit, securing a manufacturing yield and reducing the manufacturing costs and a method for manufacturing an electronic device.

An electronic device according to an aspect of the invention comprises a substrate, a functional structural body formed on the substrate and a covering structure for defining a cavity part having the functional structural body disposed therein, wherein the covering structure is provided with a side wall provided on the substrate and comprising an interlayer insulating layer surrounding the cavity part and a wiring layer; a first covering layer covering an upper portion of the cavity part and having an opening penetrating through the cavity part and composed of a laminated structure including a corrosion-resistant layer; and a second covering layer for closing the opening.

According to such a configuration, in view of the matter that the laminated structure of an interlayer insulating layer and a wiring layer is included in the covering structure for defining the cavity part having the functional structural body accommodated therein, the MEMS structural body can be easily configured by applying a semiconductor manufacturing process. Also, not only the movable part can be released by removing the surroundings of the functional structural body through the opening of the first covering layer, but thereafter, the cavity part can be sealed by forming the second covering layer for closing the opening from the outside. Furthermore, at that time, in view of the matter that the first covering layer for covering the cavity part from an upper portion includes the corrosion-resistant layer, even when the release process is carried out over a long period of time, the corrosion-resistant layer has high etching resistance and remains without hindrance, and therefore, a closing treatment by the second covering layer can be surely carried out.

It is preferable that the corrosion-resistant layer is configured by a part of the first covering layer in a thickness direction thereof.

In view of the matter that the corrosion-resistant layer is configured of a part of the first covering layer, not only the covering structure for defining the cavity part having the functional structural body accommodated therein and an electronic circuit can be structurally highly integrated, but a manufacturing process of the functional structural body and a manufacturing process of an electronic circuit can be easily made common to each other. Therefore, not only it is possible to aim to miniaturize an electronic device, but it is possible to reduce the manufacturing costs.

Also, it is preferable that the corrosion-resistant layer is composed of TiN, Ti, W, Au, Pt or an alloy thereof.

According to such a configuration, in view of the matter that the corrosion-resistant is configured of the foregoing conductive material, not only an electromagnetic mutual action between the functional structural body and the outside can be reduced, but it is possible to form the corrosion-resistant layer by a part of the wiring layer. Also, since the corrosion-resistant layer is configured of a raw material which is useful, too as a surface layer of the wiring layer or a barrier layer, enhancement in the function of the wiring layer and dissolution of the problems at the time of release process can be realized at the same time.

Also, it is preferable that the corrosion-resistant layer is configured of a layer provided in the uppermost layer of the first covering layer.

In view of the matter that the corrosion-resistant layer is provided in the uppermost layer of the first covering layer, the lower layers of the first covering layer are hardly further etched. Therefore, it is easy to secure stiffness of the first covering layer so that it is possible to achieve the process of closing the opening by the second covering layer without hindrance.

Also, it is preferable that the corrosion-resistant layer is configured of a layer provided in the lowermost layer of the first covering layer.

According to such a configuration, in view of the matter that the corrosion-resistant layer is provided in the lowermost layer of the first covering layer, even when an etching solution stays in a lower space formed due to the advance of etching in the release process, other portion of the first covering layer is hardly etched by the etching solution. Therefore, stiffness of the first covering layer is easily secured so that it is possible to achieve the process of closing the opening by the second covering layer without hindrance.

Also, it is preferable that the corrosion-resistant layer is configured of layers provided in the uppermost layer and lowermost layer of the first covering layer.

According to such a configuration, in particular, in view of the matter that the corrosion-resistant layer is formed in both the uppermost layer and the lowermost layer of the first covering layer, disappearance or reduction in the stiffness of the first covering layer is prevented more easily.

Also, it is desirable that the first covering layer is of a laminated structure in which a Ti layer, a TiN layer, an Al—Cu layer and a TiN layer are laminated in this order from the surface facing at the cavity part.

Also, it is desirable that the first covering layer is of a laminated structure in which a TiN layer, an Al—Cu layer, a Ti layer and a TiN layer are laminated in this order from the surface facing at the cavity part.

Furthermore, it is desirable that the first covering layer is of a laminated structure in which a Ti layer, a TiN layer, an Al—Cu layer, a Ti layer and a TiN layer are laminated in this order from the surface facing at the cavity part.

Also, it is desirable that the first covering layer is of a laminated structure in which a Ti layer, an Al—Cu layer and a TiN layer are laminated in this order from the surface facing at the cavity part.

Also, it is desirable that the first covering layer is of a laminated structure in which a TiN layer, an Al—Cu layer and a TiN layer are laminated in this order from the surface facing at the cavity part.

In the case where a hydrofluoric acid based solution is used for the purpose of releasing and removing a sacrifice layer and the interlayer insulating layer, in particular, Ti and TiN are a sparingly soluble material. Accordingly, when the uppermost layer and the lowermost layer of the first covering layer are composed of a Ti layer or a TiN layer singly or plural layers, disappearance or reduction in the stiffness of the first covering layer can be prevented.

Besides, W, Au, Pt or an alloy thereof can be employed as the corrosion-resistant layer.

Also, an electronic device according to another aspect of the invention comprises a substrate having a functional structural body provided in the inside of a cavity part and a CMOS circuit part placed side by side on the substrate, wherein a covering structure for defining the cavity part is provided with a side wall comprising an interlayer insulating layer surrounding the cavity part and a wiring layer and a first covering layer covering an upper portion of the cavity part and having an opening penetrating through the cavity part and composed of a laminated structure including a corrosion-resistant layer; and at least one of the interlayer insulating layer and the wiring layer is a part of an interlayer insulating layer or a wiring layer of the CMOS circuit part.

According to such a configuration, since in each of the functional structural body and the CMOS circuit part, the interlayer insulating layer and the wiring layer can be partially made common to each other, it is possible to achieve thinning or miniaturization. Also, the manufacture can be efficiently achieved by employing a semiconductor manufacturing process, and it is aimded to reduce the manufacturing costs.

Also, a resonator according to a further aspect of the invention comprises a substrate, a functional structural body formed on the substrate and a covering structure for defining a cavity part having the functional structural body disposed therein, wherein the covering structure is provided with a side wall provided on the substrate and comprising an interlayer insulating layer surrounding the cavity part and a wiring layer; a first covering layer covering an upper portion of the cavity part and having an opening penetrating through the cavity part and composed of a laminated structure including a corrosion-resistant layer; and a second covering layer for closing the opening.

Here, the functional structural body is, for example, an MEMS structural body which resonates in a specified frequency band.

According to such a configuration, in view of the matter that the first covering layer for covering the cavity part from an upper portion includes the corrosion-resistant layer, even when the release process is carried out over a long period of time, the corrosion-resistant layer has high etching resistance and remains without hindrance, and therefore, a closing treatment by the second covering layer can be surely carried out, and a resonator with high reliability can be realized.

Also, an oscillator according to a still further aspect of the invention comprises a substrate having a functional structural body provided in the inside of a cavity part and an oscillation circuit-containing CMOS circuit part placed side by side on the substrate, wherein a covering structure for defining the cavity part is provided with a side wall comprising an interlayer insulating layer surrounding the cavity part and a wiring layer and a first covering layer covering an upper portion of the cavity part and having an opening penetrating through the cavity part and composed of a laminated structure including a corrosion-resistant layer; and at least one of the interlayer insulating layer and the wiring layer is a part of an interlayer insulating layer or a wiring layer of the CMOS circuit part.

Here, the functional structural body is, for example, an MEMS structural body which resonates in a specified frequency band.

According to such a configuration, in view of the matter that the functional structural body region and the CMOS circuit part region are placed side by side on the substrate, miniaturization of an oscillator can be realized. Also, in view of the matter that the first covering layer for covering the cavity part from an upper portion includes the corrosion-resistant layer, even when the release process is carried out over a long period of time, the corrosion-resistant layer has high etching resistance and remains without hindrance, and therefore, a closing treatment by the second covering layer can be surely carried out, and an oscillator with high reliability can be provided.

Also, a method for manufacturing an electronic device including a substrate, a functional structural body formed on the substrate and a covering structure for defining a cavity part having the functional structural body disposed therein according to an even further aspect of the invention comprises: forming the functional structural body together with a sacrifice layer on the substrate; forming an interlayer insulating layer in the periphery including an upper part of the functional structural body; forming a first covering layer composed of a laminated structure including a corrosion-resistant layer on the interlayer insulating layer and having an opening; removing the interlayer insulating layer and the sacrifice layer on the functional structural body through the opening; and forming process of forming a second covering layer for closing the opening.

According to such a manufacturing method, in view of the matter that after the first covering layer forming process including the corrosion-resistant layer for covering the cavity part in which the functional structural body is disposed from an upper portion, the release process is carried out, even when the release process is carried out over a long period of time, the corrosion-resistant layer has high etching resistance and remains without hindrance, and therefore, a closing treatment by the second covering layer can be surely carried out, and an electronic device with high reliability can be provided.

Furthermore, a method for manufacturing an electronic device including a substrate having a functional structural body provided in the inside of a cavity part and a CMOS circuit part placed side by side on the substrate according to an even still further aspect of the invention comprises a functional structural forming process of forming the functional structural body together with a sacrifice layer on the substrate; a process of forming a CMOS transistor; an interlayer insulating layer forming process of forming an interlayer insulating layer in the periphery including an upper part of the functional structural body and an upper part of the CMOS transistor; a wiring layer forming process of forming a first covering layer for covering the cavity part and having an opening, a wiring layer connected to the functional structural body and a wiring layer connected to the CMOS transistor in an upper part of the interlayer insulating layer; a passivation membrane forming process of forming a passivation membrane in the periphery including the first covering layer, the wiring layer connected to the functional structural body and the wiring layer connected to the CMOS transistor; a release process of removing the interlayer insulating layer and the sacrifice layer on the functional structural body through the opening; and a second covering layer forming process of forming a second covering layer for closing the opening.

According to such a manufacturing method, the interlayer insulating layer and some of the wiring layers in each of the functional body and the CMOS circuit part can be formed in a common process by employing a semiconductor manufacturing process, and simplification and shortening of the manufacturing process can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Next, embodiments of the invention are described in detail with reference to the accompanying drawings. For convenience of illustration, the drawings as referred to in the following description are each a schematic view in which the reduction in length and width and thickness of members or portions is different from that in an actual scale.

Embodiment 1

First of all, a manufacturing method of an electronic device according to Embodiment 1 is described. FIGS. 1 to 8 are each a diagrammatic process view showing a manufacturing method of an electronic device according to an embodiment of the invention.

Figure 1:
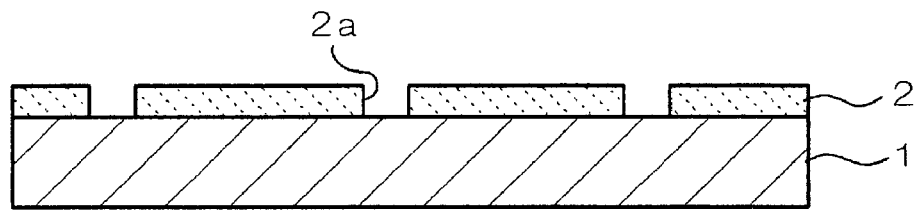
FIG. 1 is a diagrammatic process cross-sectional view showing a manufacturing process according to Embodiment 1.
Figure 2:
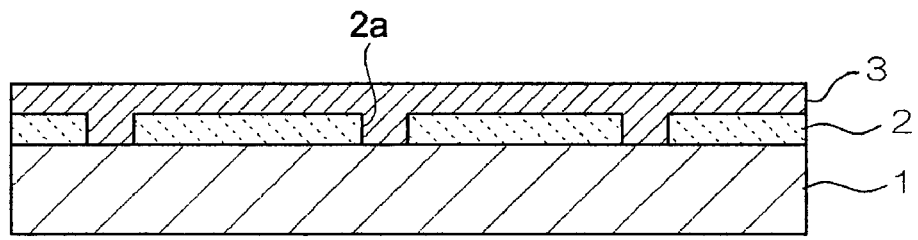
FIG. 2 is a diagrammatic process cross-sectional view showing a manufacturing process according to Embodiment 1.
Figure 3:
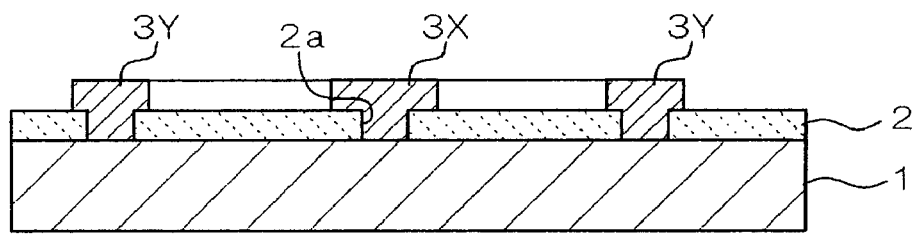
FIG. 3 is a diagrammatic process cross-sectional view showing a manufacturing process according to Embodiment 1.

FIGS. 1 to 3 are each a cross-sectional view showing a functional structural body forming process for forming a functional structural body 3X together with a sacrifice layer 2 on a substrate 1. First of all, the substrate 1 composed of a semiconductor substrate or the like as shown in FIG. 1 is prepared. Though a semiconductor substrate such as a silicon substrate is the most preferable as the substrate 1, various substrates such as a ceramics substrate, a glass substrate, a sapphire substrate, a diamond substrate and a synthetic resin substrate can be used. In case of using a semiconductor substrate, a prescribed semiconductor integrated circuit (not illustrated; for example, a CMOS transistor) can be incorporated in the substrate 1 in advance or on the way of an appropriate process. In the manufacturing method of the present embodiment, a semiconductor substrate provided with an appropriate impurities region (not illustrated) in a surface layer part of the substrate 1 is used. Also, the manufacturing method is set up in such a manner that an appropriate wiring structure is formed on this semiconductor substrate, thereby forming an electronic device (semiconductor integrated circuit) by a CMOS process as a whole. However, the embodiment of the invention is not limited to the semiconductor circuit but can be applied to electronic devices provided with an electronic circuit of every kind (inclusive of a mere wiring pattern) other than the semiconductor circuit.

Next, the sacrifice layer 2 is formed on a surface of the substrate 1. This sacrifice layer 2 can be configured of, for example, a silicon oxide membrane or a PSG (phosphorus-doped glass) membrane and is formed by a CVD method, a sputtering method or the like. In the illustrated embodiment, an opening 2a for forming a supporting part of an MEMS structural body as described later is formed in a proper place of the sacrifice layer 2 by an appropriate patterning treatment such as a method of carrying out etching using a patterning mask formed by a photolithography method or the like.

Next, as shown in FIG. 2, a functional layer 3 configured of a conductive silicon membrane (doped polycrystalline silicon) or the like is formed on the sacrifice layer 2. This functional layer 3 is connected to the substrate 1 (for example, a non-illustrated lower electrode formed on the substrate 1) through the above-formed opening 2a. The functional layer 3 is formed by a sputtering method, a CVD method or the like. Then, by patterning this functional layer 3 by an appropriate patterning method, a functional structural body 3X is formed as shown in FIG. 3. Here, the functional structural body 3X is an MEMS structural body and is illustrated in such a manner that it is configured of a single layer. However, the functional structural body 3X may be formed of a laminated structure of two or more layers. The functional structural body 3X is sometimes expressed as an MEMS structural body 3X.

In the illustrated embodiment, the MEMS structural body 3X in a diaphragm shape which is provided with a supporting part corresponding to the opening 2a of the sacrifice layer 2 in a central lower part thereof is provided. However, illustration of counter electrodes and the like is omitted. Also, the illustrated embodiment schematically shows the MEMS structural body 3X but does not precisely express an actual structure. As the MEMS structural body 3X, a movable part provided with a planar pattern of every kind, for example, a comb form, a beam form and a disc form can be formed. Also, MEMS structural bodies configured as a device having an arbitrary function, for example, one to be used as an oscillator, one to be used as an actuator and one to be used as a sensor, can be formed.

Also, the functional structural body 3X may be one which configures a functional structural body of every kind other than the MEMS structural body, for example, a quartz oscillator, an SAW (surface acoustic wave) device, an acceleration sensor and a gyroscope. That is, the electronic device according to an embodiment of the invention may be any electronic device provided with an arbitrary functional structural body capable of being disposed in a cavity part.

In the present embodiment, as shown in FIG. 3, a lower surrounding wall (guard ring) 3Y configured so as to planarly surround the MEMS structural body 3X is formed simultaneously with the MEMS structural body X.

The lower surrounding wall 3Y is one configured of the same layer and same material as in the MEMS structural body 3X and is formed simultaneously with the MEMS structural body 3X by patterning the functional layer 3. In the illustrated embodiment, though the planar shape of the lower surrounding wall 3Y is formed, for example, in a quadrangular (square) shape, it may be any shape such as a circle and a polygon so far as it is a closed shape for surrounding the MEMS structural body 3X. The lower surrounding wall 3Y is preferably made of a raw material which is not substantially removed in a release process of removing the sacrifice layer 2 and interlayer insulating layers 4 and 6 (see FIG. 4) as described later (in other words, the removal method of the release process is a method having selectivity against etching between the raw material to be removed and the lower surrounding wall 3Y) and more desirably made of a conductive material. Examples of the conductive material include conductive semiconductors (semiconductors doped in a high concentration), polysilicons and metallic materials to be used in a corrosion-resistant layer as described later.

Figure 4:
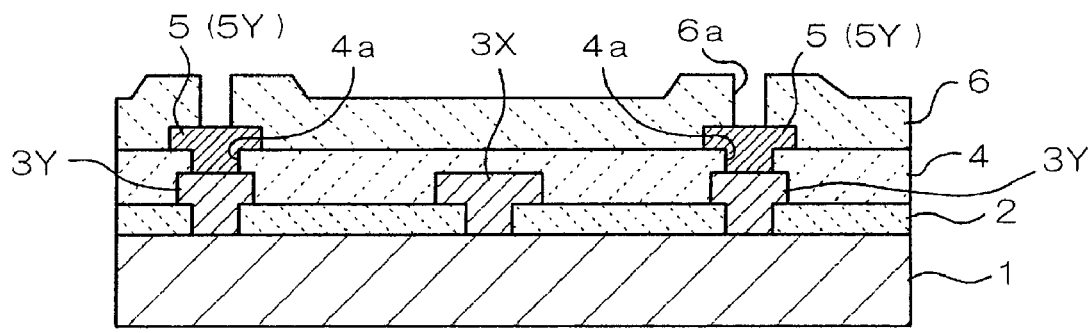
FIG. 4 is a diagrammatic process cross-sectional view showing a manufacturing process according to Embodiment 1.

FIG. 4 is a cross-sectional view showing an interlayer insulating layer forming process for forming an interlayer insulating layer in the periphery including an upper part of the MEMS structural body 3X.

As shown in FIG. 4, an interlayer insulating layer 4 composed of an insulator such as silicon oxide (for example, a CVD membrane using, as a raw material gas, TEOS (tetraethyl ortho-silicate), etc.), a wiring layer 5 composed of a conductor such as aluminum and an interlayer insulating layer 6 composed of an insulator such as silicon oxide are successively formed on the MEMS structural body 3X and the lower surrounding wall 3Y. This laminated structure is formed by the same method as in a usual CMOS process. This laminated structure configures a covering structure for defining a cavity part for finally accommodating the MEMS structural body 3X therein. Also, a part of the wiring layer 5 is made in a state that it is exposed by a through-hole 6a for conductively connecting to an upper layer structure. The lamination number of the laminated structure including the interlayer insulating layer 4, the wiring layer 5 and the interlayer insulating layer 6 is appropriately configured as occasion demands. For example, in an actual CMOS process, there may be the case where more wiring layers are laminated via an interlayer insulating layer, respectively.

In case of the present embodiment, by forming an opening part 4a for exposing the lower surrounding wall 3Y in the interlayer insulating layer 4 and forming a part of the wiring layer 5 in this opening part 4a, a surrounding wall (guard ring) 5Y having a planar shape so as to surround the MEMS structural body 3X is formed. Thought other wiring layer 5 than the surrounding wall 5Y is not illustrated in FIG. 4, the wiring layer 5 is actually formed such that a prescribed wiring pattern is formed, and a part thereof becomes the illustrated surrounding wall 5Y. However, it is desirable that this surrounding wall 5Y is not conductively connected to other wiring pattern. Here, similar to the foregoing lower surrounding wall 3Y, the surrounding wall 5Y is one provided with a closed planar shape for surrounding the MEMS structural body 3X, such as a circle and a polygon. In that case, when the opening part 4a and a connection portion of the surrounding wall 5Y which goes through the inside thereof are formed in a closed shape for surrounding the MEMS structural body 3X, the lower surrounding wall 3Y and the surrounding wall 5Y are configured as an integrated side wall.

In the illustrated embodiment, the wiring layer is formed as a single layer. However, plural wiring layers 5 may be laminated via a non-illustrated other interlayer insulating layer. In that case, the surround layer 5Y is also formed as plural layers. Here, it is preferable that the plural surrounding walls 5Y are connected through an opening part of the interlayer insulating layer. In particular, when the opening part itself and the connection portion of the surrounding wall which goes through the inside thereof are formed in a closed shape for surrounding the MEMS structural body 3X, the plural surrounding walls 5Y are configured as an integrated side wall.

Figure 5:
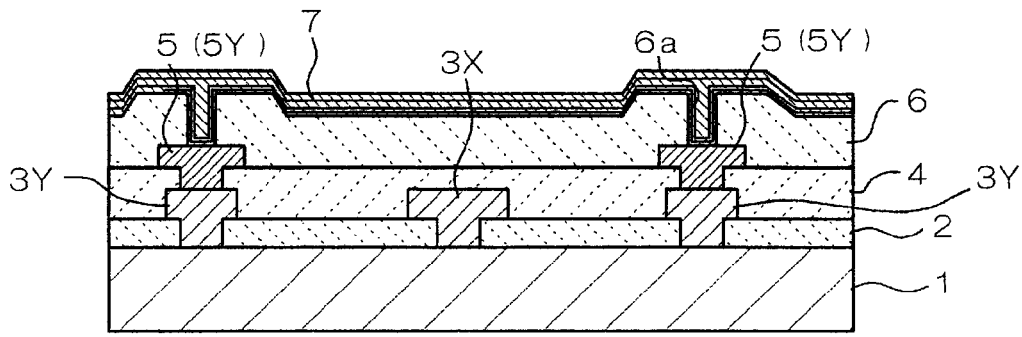
FIG. 5 is a diagrammatic process cross-sectional view showing a manufacturing process according to Embodiment 1.
Figure 6:
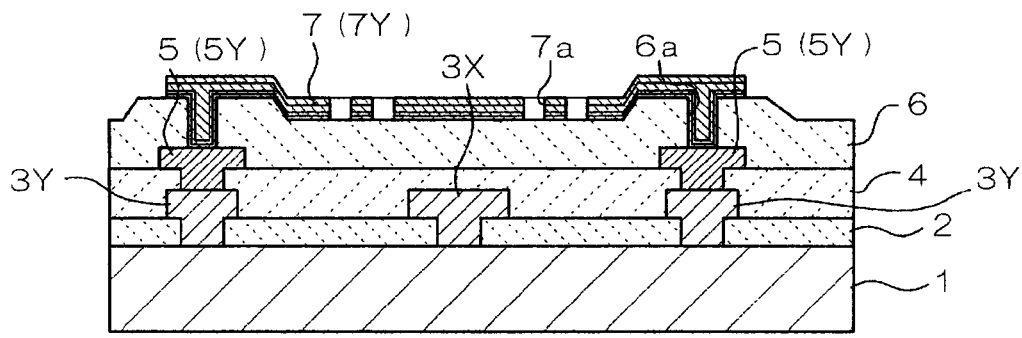
FIG. 6 is a diagrammatic process cross-sectional view showing a manufacturing process according to Embodiment 1.

Thereafter, a conductor layer is formed on the interlayer insulating layer 6 as shown in FIG. 5; by patterning this conductor layer, a wiring layer 7 is formed; and a first covering layer 7Y is formed as a part of the wiring layer 7 as shown in FIG. 6. Here, the first covering layer 7Y is disposed so as to cover an upper portion of the MEMS structural body 3X. Also, in case of the present embodiment, plural openings 7a are formed in the first covering layer 7Y. For example, the openings 7a are planarly arranged in length and width, and a part of the first covering layer 7Y is reticulately configured as a whole. The openings 7a are formed simultaneously with patterning a conductor layer to form the wiring layer 7. Accordingly, the manufacturing process is not different at all from that in case of not forming the first covering layer 7Y (namely, the case where only a wiring pattern of the wiring layer 7 is formed).

Here, the first covering layer 7Y is connected to the wiring layer 5 via the through-hole 6a. In particular, it is preferable that the through-hole 6a is formed in a closed shape for surrounding the MEMS structural body 3X and that the connecting portion to the surrounding wall 5Y of the first covering layer 7Y, which goes therethrough, is also formed in a closed shape for surrounding the MEMS structural body 3X.

As described above, in the case where an integrated side wall 10 Y (see FIG. 8) is formed by the lower surrounding wall 3Y, the surrounding wall 5Y and the first covering layer 7Y, the MEMS structural body 3X is completely surrounded by the substrate 1, the side wall 10Y and the first covering layer 7Y from a lower portion, an upper portion and a side portion.

It is preferable that the lower surrounding wall 3Y, the surrounding wall 5Y and the first covering layer 7Y, or the side wall 10Y (see FIG. 8) formed by integrating them is respectively or integrally given a prescribed potential (for example, an earthing potential). According to this, the MEMS structural body 3X can be electromagnetically blocked to some extent against the outside; and as a blocking rate against the MEMS structural body 3X increases, an electromagnetic mutual action (namely, noise) between the MEMS structural body 3X and the outside can be reduced. The configuration of the first covering layer 7Y is described later with reference to FIG. 9.

Figure 7:
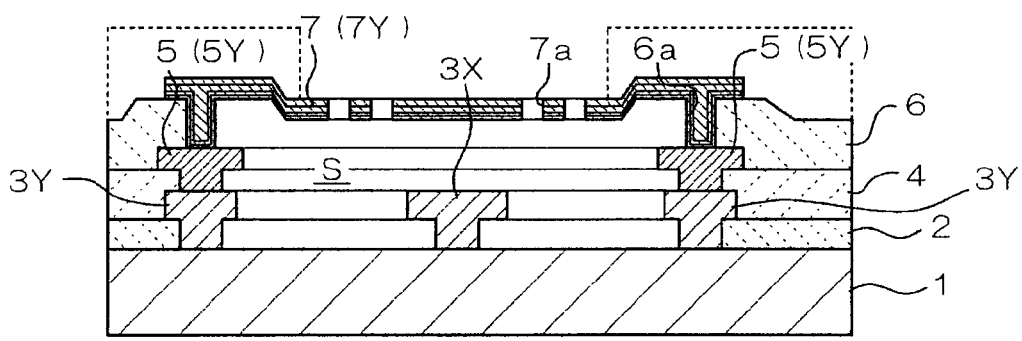
FIG. 7 is a diagrammatic process cross-sectional view showing a manufacturing process according to Embodiment 1.

Next, as shown in FIG. 7, by removing the interlayer insulating layer 6, the interlayer insulating layer 4 and the sacrifice layer 2 existing in the surroundings of the MEMS structural body 3X through the plural scattered openings 7a, a cavity part S for accommodating the MEMS structural body 3X therein is formed (release process). Here, the removal of the interlayer insulating layer 6, the interlayer insulating layer 4 and the sacrifice layer 2 can be carried out by wet etching with a hydrofluoric acid based solution such as hydrofluoric acid (HF) and buffer hydrofluoric acid (BHF), dry etching with a hydrofluoric acid based gas (vapor), etc. or others. Since such an etching method is isotropic etching, the release of the MEMS structural body 3X can also be easily achieved through the small openings 7a. This etching is carried out in a state that other portion than the surface of the first covering layer 7Y is covered by an etching mask (shown by a dotted line in FIG. 7) composed of a resist or the like.

The foregoing etching method does not substantially exhibit removal performance against the MEMS structural body 3X, the lower surrounding wall 3Y, the surrounding wall 5Y and the first covering layer 7Y. Therefore, even when the interlayer insulating layer 6, the interlayer insulating layer 4 and the sacrifice layer existing in the surroundings of the MEMS structural body 3X are completely removed, it is possible to prevent the cavity part S from expansion to the outside of the lower surrounding wall 3Y and the surrounding wall 5Y. Here, when the release process is finished, the cavity part S is thoroughly rinsed. For example, the cavity part S is washed with water, and thereafter, the moisture is completely removed by using a displacement method or the like. The lower surrounding wall 3Y, the surrounding wall 5Y and a lower part of the first covering layer 7Y (connecting part in the through-hole 6a) configure the foregoing surrounding covering part.

Figure 8:
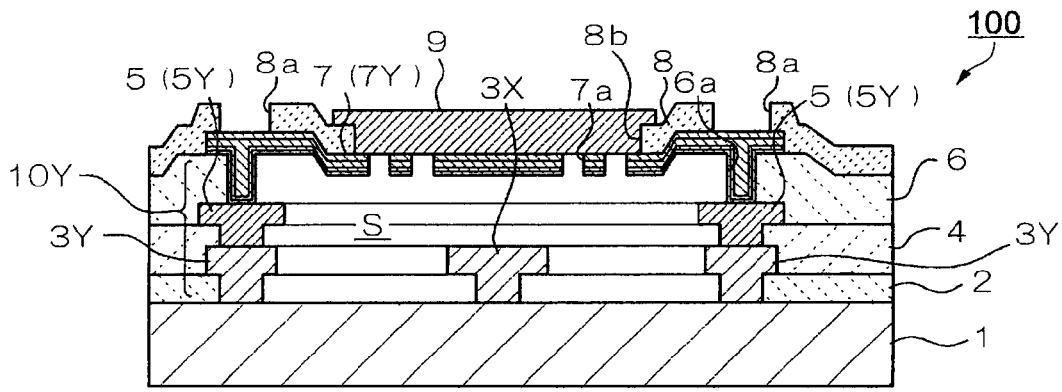
FIG. 8 is a diagrammatic longitudinal cross-sectional view of an electronic device according to Embodiment 1.

Next, a passivation membrane 8 configured of silicon oxide, silicon nitride, a resin material or the like is formed on the interlayer insulating layer 6, the first covering layer 7 and other portion (not illustrated) of the wiring layer 7 formed simultaneously therewith as shown in FIG. 8. As this passivation membrane 8, a surface passivation membrane made of silicon nitride, an insulating resist or the like can be used. By forming an opening part 8a in the passivation membrane 8 by dry etching or the like, a part of each of the first covering layer 7Y and the wiring layer 7 is exposed to form a pad part for conductive connection. Also, an opening part 8b is formed in the passivation membrane 8 simultaneously with the opening part 8a, and a portion existing in an upper portion of the MEMS structural body 3X (a region where the opening 7a is formed) is exposed by this opening part 8b. So far as the passivation membrane 8 is made of a material capable of withstanding etching of the release process, or a mask of a resist or the like is formed on a surface of the passivation membrane 8, the formation and patterning of the passivation membrane 8 may be carried out prior to the release process as described later.

Figure 9:
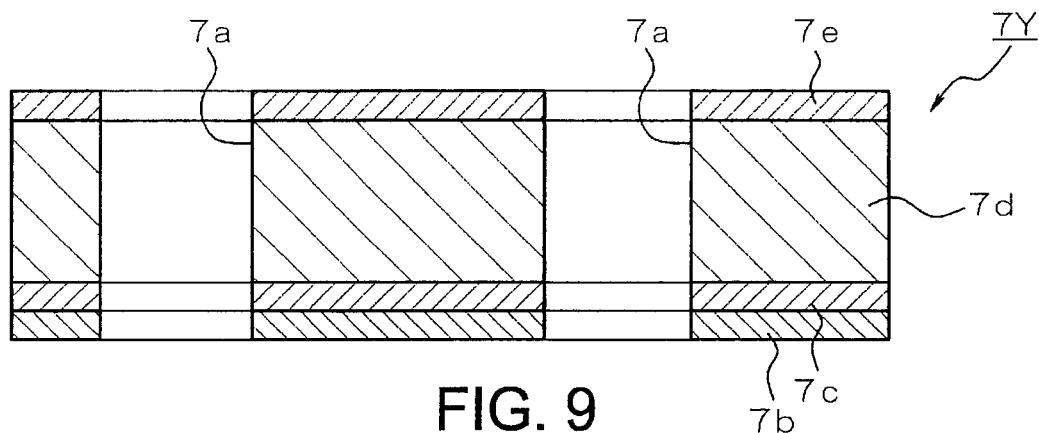
FIG. 9 is an enlarged partial cross-sectional view showing a cross-sectional shape of a first covering layer according to Embodiment 1.

As shown in FIG. 9, the wiring layer 7 (first covering layer 7Y) is configured of a laminated structure of four layers including a first layer 7b as the lowermost layer which is made of Ti, a second layer 7c which is made of TiN, a third layer 7d which is made of Al—Cu (alloy) and a fourth layer 7e as the uppermost layer which is made of TiN from the surface facing at the cavity part S. The first layer 7b enhances coverage against the interlayer insulating layer 6 as the lower layer and is formed in a thickness of from about 10 to 100 nm, and preferably from about 20 to 70 nm by, for example, a vapor deposition method, a sputtering method or the like. The second layer 7c is a barrier layer for preventing the penetration of constitutional raw materials of the lower layer (for example, an Si atom), impurities or the like and is formed by, for example, a sputtering method, a CVD method, an ion plating method or the like and made to have a thickness of from about 50 to 200 nm, and preferably from about 80 to 150 nm. The third layer 7d is configured of an alloy obtained by adding not more than 1 wt % of Cu to Al and is a principal layer for guaranteeing conductivity of the wiring layer 7. The third layer 7d is formed by, for example, a vapor deposition method or a sputtering method and made to have a thickness of from about 500 to 1,000 nm, and preferably from about 700 to 900 nm. The fourth layer 7e is configured as an antireflection membrane for photo process and can be formed by, for example, the same method as in the second layer 7c. The fourth layer 7e is made to have a thickness of from about 20 to 200 nm, and preferably from about 50 to 100 nm.

The first covering layer 7Y has the same laminated structure as in the wiring layer 7. Here, each of the raw materials which configure the wiring layer 7 is one provided with resistance to etching to be used at the time of a release process as described later (this etching is basically used for the purpose of removing a configuration portion mainly composed of silicon oxide). However, since the third layer (Al—Cu) 7d does not have a thoroughly high etching selection ratio to silicon oxide, it is possibly removed by the etching over a long period of time. On the other hand, the first layer (Ti) 7b, the second layer (TiN) 7c and the fourth layer (TiN) 7e have a high etching selection ratio so that they thoroughly withstand the etching over a long period of time.

In the present embodiment, a layer composed of a raw material provided with resistance to the etching solution mainly composed of hydrofluoric acid is called a corrosion-resistant layer, and the first layer 7b, the second layer 7c and the fourth layer 7e are corresponding to the corrosion-resistant layer. Here, though various materials such as resin materials can be considered as the raw material for configuring the corrosion-resistant layer, those configured of a metal or a metallic compound such as TiN, Ti, W, Au and Pt are preferable. The laminated structure of the wiring layer 7 can also be used in other wiring layers such as the wiring layer 5. Such is favorable as the structure of the surrounding wall 5Y because the etching resistance at the time of release process is enhanced.

Though the laminated structure of the wiring layer 7 (first covering layer 7Y) is a configuration capable of being favorably used as a wiring layer to be used in a semiconductor process, even other configurations than the configuration in the illustrated embodiment can be adapted as this configuration.

For example, the first covering layer 7Y may be of a laminated structure in which a TiN layer, an Al—Cu layer, a Ti layer and a TiN layer are laminated in this order from the surface facing at the cavity part S and may also be of a laminated structure in which a Ti layer, a TiN layer, an Al—Cu layer, a Ti layer and a TiN layer are laminated in this order from the surface acing at the cavity part S.

Furthermore, the first covering layer 7Y may be of a laminated structure in which a Ti layer, an Al—Cu layer and a TiN layer are laminated in this order from the surface facing at the cavity part S and may also be of a laminated structure in which a TiN layer, an Al—Cu layer and a TiN layer are laminated in this order from the surface facing at the cavity part S.

Finally, as shown in FIG. 8, by forming a second covering layer 9 on the first covering layer 7Y, the opening 7a is closed, thereby sealing the cavity part S. An electronic device 100 is thus accomplished. It is preferable that this second covering layer 9 is formed by a vapor phase epitaxy method, for example, a CVD method and a sputtering method. This is because according to this, the cavity part S can be sealed in a state of reduced pressure as it is. As the second covering layer to be formed by a vapor phase epitaxy method, insulators such as silicon oxide and silicon nitride (CDV method), metals (for example, Al, W and Ti) or other conductive materials (sputtering method) and the like are exemplified.

In this process, in the case where the second covering layer 9 is configured of a metal or other conductive material, a connection pad conductively connected to the wiring layer 7 may be formed by remaining a portion fabricated on the opening part 8a. Also, the foregoing upper covering part is configured of the first covering layer 7Y and the second covering layer 9 in the present embodiment.

Furthermore, it is preferable that the opening 7a is formed at a position offset from a position just above the MEMS structural body 3X. In the illustrated embodiment, the configuration is made in such a manner that the opening 7a exists at a position slipped in a planar direction relative to the MEMS structural body 3X. In such a way, it is possible to avoid a fault such as the attachment of the second covering layer 9 or the like to the MEMS structural body 3X at the time of formation of the second covering layer 9 or the like. Though the slippage in the planar direction varies depending upon the formation method of the second covering layer 9 or the like, in case of the gas phase epitaxy method, it is about 0.5 µm at a minimum. Actually, the slippage is preferably from about 0.5 to 5.0 µm.

The electronic device of the present embodiment has a covering structure in which the cavity part S for accommodating the MEMS structural body 3X therein is surrounded by the laminated structure of the interlayer insulating layers 4 and 6 and the wiring layers 5 and 7, and the cavity part S is defined by this covering structure. Accordingly, by configuring the first covering layer 7Y for covering the upper part of the cavity part S by a part of the wiring layer 7, it is possible to enhance the integrality with an electronic circuit requiring the foregoing laminated structure. Therefore, not only it is possible to aim to miniaturize the electronic device, but it is possible to suppress the manufacturing costs. In particular, when the first covering layer 7Y for covering the MEMS structural body 3X from an upper portion is configured of a conductive material composed of a part of the wiring layer 7, an electromagnetic mutual action with the outside can be reduced. In that case, needless to say, it is more favorable that the second covering layer 9 is also configured of a conductive material.

Also, in the foregoing covering structure, when the surrounding wall 5Y having a closed planar shape for surrounding the MEMS structural body 3X is provided by a part of the wiring layer, the integrality with an electronic circuit requiring the foregoing laminated structure can be enhanced in the same manner as described above. Therefore, not only it is possible to aim to miniaturize the electronic device, but it is possible to suppress the manufacturing costs. In particular, since the range of side etching at the time of release process can be suppressed due to the presence of the surrounding wall 5Y, not only it is easy to miniaturize the cavity part S for accommodating the MEMS structural body 3X therein, but it is possible to reduce an electromagnetic mutual action between the MEMS structural body 3X and the outside due to the presence of the surrounding wall 5Y which is configured of a conductive material composed of a part of the wiring layer 5.

Also, in the present embodiment, since the first covering layer 7Y which is configured of a part of the wiring layer 7 existing in an upper portion of the MEMS structural body 3X has the corrosive-resistant layers inclusive of the first layer 7b, the second layer 7c and the fourth 7e, even when the etching time is long in the release process, it is possible to prevent disappearance or thinning of the first covering layer 7Y. In general, since the time of the release process through the opening 7a is much longer than that in the case where the first covering layer 7Y does not exist, there is a possibility that even a raw material which is originally hardly etched with a hydrofluoric acid based etchant partially disappears, or its shape collapses. However, in case of the foregoing corrosion-resistant layer configured of a metal or a metallic compound such as TiN, Ti, W, Au and Pt, it remains even after the release process without any problem. As a result, it is possible to form the second covering layer 9 without hindrance.

In particular, not only the foregoing raw material of TiN, Ti, W, Au or Pt has high resistance to a hydrofluoric acid based etching solution, but it can be used for the conductive material of the wiring layer having conductivity or the like and in particular, has high affinity with the semiconductor manufacturing process. Also, such a raw material is not merely a conductive material but, for example, has additional functions against the conductive material, inclusive of high-degree barrier properties (for example, TiN), ohmic contact properties (for example, Au) and corrosion resistance or oxidation resistance against other substances than the etching solution (for example, Ti, TiN, W and Pt). Since these additional functions are especially useful as a surface layer of a conductive material, it is thought that the field where such a raw material is useful at the same time for other structure other than the MEMS structural body of the electronic device (for example, a wiring of an electronic circuit) is quite broad.

In the first covering layer 7Y, in view of the matter that the fourth layer 7e which is a corrosion-resistant layer exists in the uppermost layer and that the first layer 7b which is a corrosion-resistant layer exists in the lowermost layer, it is possible to effectively avoid the corrosion of the third layer 7d against the etching solution. Though so far as a corrosion-resistant layer exists in any one of the uppermost layer or the lowermost layer, such an effect is thoroughly obtainable, it is especially preferable that a corrosion-resistant layer is formed in the uppermost layer. Also, it is the most desirable that a corrosion-resistant layer is formed in both the uppermost layer and the lowermost layer. While the case where a process which is different from a usual semiconductor manufacturing process is required may be considered, the whole of the first covering layer 7Y (wiring layer 7) may be configured of a corrosion-resistant layer. It does not matter that the first covering layer 7Y is, for example, configured of a single layer of TiN.

Furthermore, in the foregoing configuration, when the integrated side wall 10Y is formed so as to surround the MEMS structural body 3X, the removal range in the release process can be planarly completely limited, and therefore, it is possible to aim to further miniaturize the cavity part S. Also, when the whole of the side wall 10Y is configured of a conductive material, a blocking degree by the conductor of the MEMS structural body 3X is further enhanced, and therefore, it is possible to more reduce the electromagnetic mutual action between the MEMS structural body 3X and the outside. In particular, in view of the matter that the side wall 10Y and the first covering layer 7Y are connected to each other, the electromagnetic blocking effect of the MEMS structural body 3X can be further enhanced.

Figure 10:
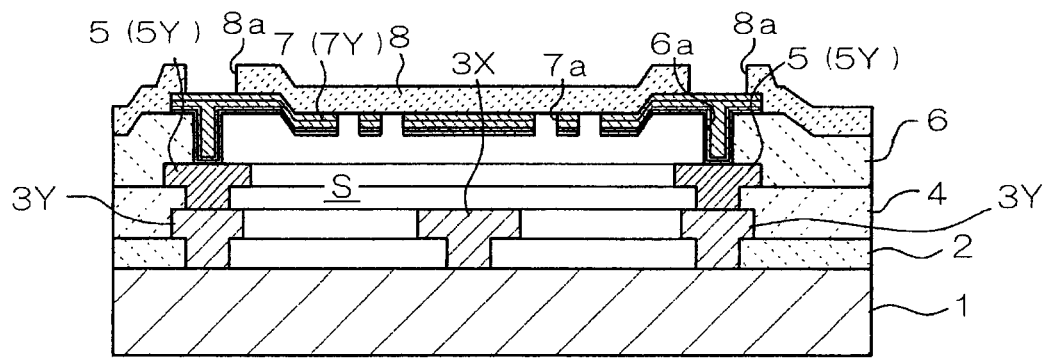
FIG. 10 is a longitudinal cross-sectional view showing a structure of other electronic device.

FIG. 10 shows an embodiment in which the passivation membrane 8 is used as the second covering layer. In that case, it is preferable that the second covering layer is configured of an insulator. According to this, in view of the matter that the passivation membrane 8 also works as the second covering layer, the process number is reduced (the fabrication and patterning of the second covering layer 9 are not necessary), and therefore, the manufacturing costs can be further reduced.

Figure 11:
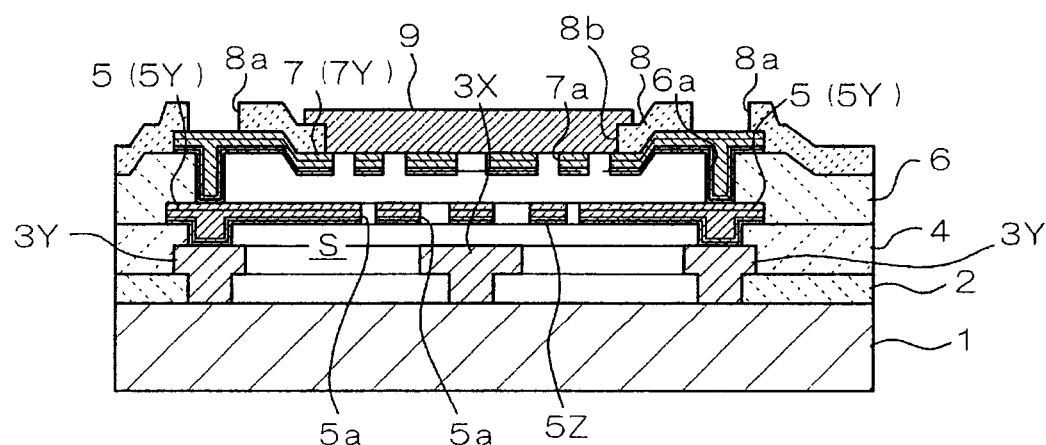
FIG. 11 is a longitudinal cross-sectional view showing a structure of a different electronic device.

FIG. 11 shows an embodiment in which a third covering layer 5Z which covers an upper portion of the MEMS structural body 3X and which is provided with openings 5a are configured of a part of the wiring layer 5. Here, the configuration is made in such a manner that the third covering layer 5Z planarly overlaps the openings 7a of the first covering layer 7Y and that the openings 5a planarly overlap the first covering layer 7Y. That is, the planar region exposed by the opening 7a is covered by the third covering layer 5Z, and the planar region exposed by the opening 5a is covered by the first covering layer 7Y. Therefore, for example, even in the case where the second covering layer 9 is fabricated by a vapor phase epitaxy method, it is possible to prevent the attachment of the raw material of the second covering layer 9 to the MEMS structural body 3X. Accordingly, as described in the previous embodiment, it is not necessary to provide the planar range of the MEMS structural body 3X and the opening range of the opening 7a planarly offset from each other. In that case, the foregoing upper covering part is configured of the first covering layer 7Y, the second covering layer 9 and the third covering layer 5Z, and the foregoing first covering layer is configured of the first covering layer 7Y and the third covering layer 5Z.

In that case, the third covering layer 5Z is also exposed to the etching solution over a long period of time in the release process. Therefore, by using the same laminated structure as in the first covering layer 7Y for the third covering layer 5Z, the third covering layer 5Z can be made to remain without hindrance by the corrosion-resistant layer to be contained in the third covering layer 5Z. Here, similar to the first covering layer 7Y, it is preferable that the uppermost layer or the lowermost layer of the third covering layer 5Z is configured of a corrosion-resistant layer. It is especially desirable that both the uppermost layer and the lowermost layer of the third covering layer 5Z are configured of a corrosion-resistant layer.

Figure 12A:
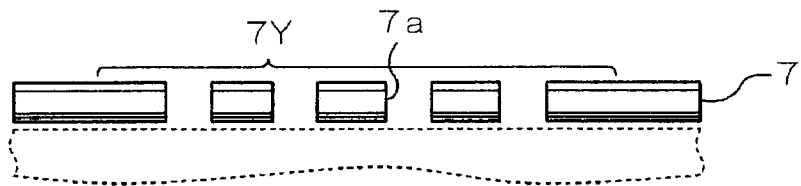
FIGS. 12A to 12D are each a diagrammatic partial process explanatory view showing other manufacturing process.
Figure 12B:
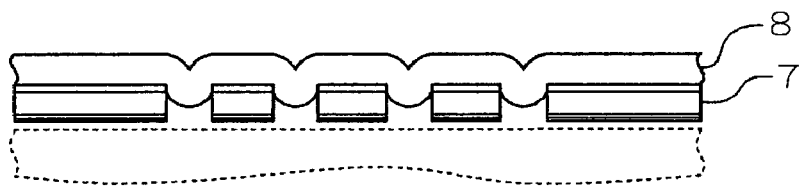

FIGS. 12A to 12D are each a diagrammatic explanatory view showing a manufacturing process different from the foregoing embodiment. In FIGS. 12A to 12D, only structures of the wiring layer 7 (first covering layer 7Y) and an upper layer thereof are shown, and other structures are omitted. In this manufacturing process, as shown in FIG. 12A, the first covering layer 7Y is formed at the same time in the wiring forming process for forming the wiring layer 7, and the openings 7a are proved. Next, as shown in FIG. 12B, the passivation membrane 8 is formed on the wiring layer 7 and the first covering layer 7Y.

Figure 12C:
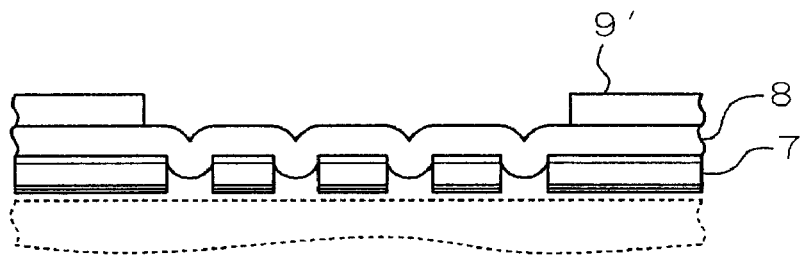
Figure 12D:
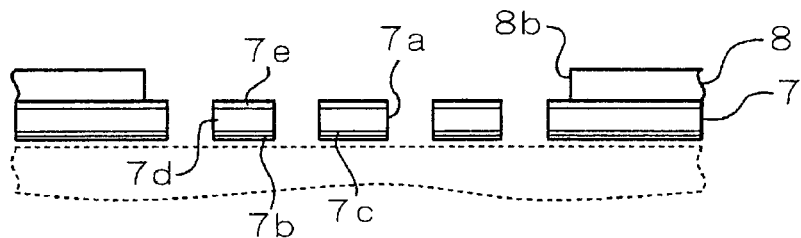

Thereafter, as shown in FIG. 12C, the passivation membrane 8 on the first covering layer 7Y is removed by dry etching using an etching mask 9' formed of a photoresist, etc. or other methods; and as shown in FIG. 12D, the opening part 8b for exposing the first covering layer 7Y on the passivation membrane 8 is formed. At that time, the configuration is made in such a manner that at least a part of the fourth layer 7e remains on the surface of the first covering layer 7Y opened by the opening part 8b. That is, when the fourth layer 7e is also removed by partial removal of the passivation membrane 8, there is a high possibility that the third layer 7d is corroded in the release process. Therefore, the treatment time and treatment condition and the like of etching in the drying etching or the like are optimized in such a manner that at least a part of the fourth layer 7e which is a corrosion-resistant layer remains on the entire surface of the first covering layer 7Y. The treatment contents of this process are the same as those described in the foregoing embodiment.

In this manufacturing process, after forming the passivation film 8 and also forming its opening part 8b, the release process is carried out through the openings 7a of the first covering layer 7Y. According to this method, since the passivation membrane 8 can be used as an etching mask at the time of release process, the resist forming process for forming the etching mask 9' in the foregoing embodiment or the like can be omitted.

When the MEMS structural body 3X having the foregoing configuration is formed into SAW or an oscillator composed of a mover and a stator, the electronic device 100 of the present embodiment (see FIG. 8) is able to configure a resonator.

According to such configuration and manufacturing method, in view of the matter that the first covering layer 7Y for covering the cavity part S from an upper portion includes a corrosion-resistant layer, even when the release process is carried out over a long period of time, the corrosion-resistant layer remains without hindrance because it has high etching resistance. Therefore, the closing treatment by the second covering layer can be surely carried out, and a resonator with high reliability can be realized.

Embodiment 2

Subsequently, an electronic device according to Embodiment 2 is described with reference to the accompanying drawings. The electronic device according to the present embodiment is characterized in that a semiconductor substrate is used as a substrate and that a functional structural body disposed in the inside of a cavity part and a CMOS circuit part are placed side by side on the substrate.

Figure 13:
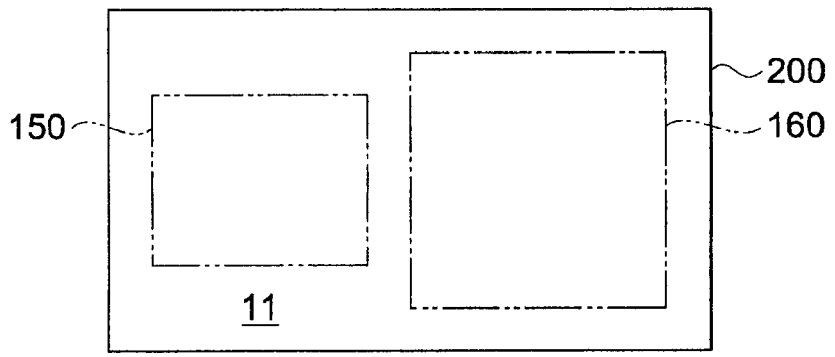
FIG. 13 is a planar layout view showing a diagrammatic configuration of an electronic device according to Embodiment 2.

FIG. 13 is a planar layout view showing a diagrammatic configuration of the electronic device according to Embodiment 2. In FIG. 13, an electronic device 200 is configured in such a manner that a functional structural body region 150 and a CMOS circuit part region 160 are placed side by side on a substrate 11. A structure in which a part of the functional structural body region 150 and a part of the CMOS circuit part region 160 intersect each other in a cross-sectional direction may be taken. The functional structural body region is hereinafter sometimes expressed as an MEMS structural body region.

Next, a cross-sectional structure of the electronic device 200 is described.

Figure 14:
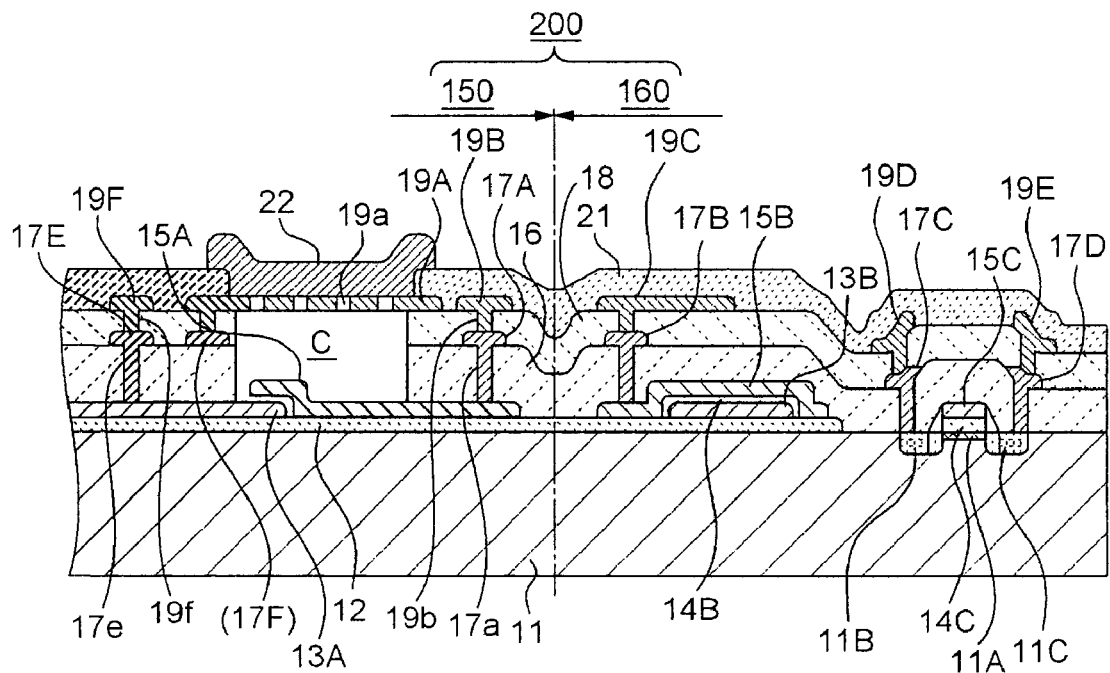
FIG. 14 is a cross-sectional view showing a diagrammatic structure of a principal part of an electronic device according to Embodiment 2.

FIG. 14 is a cross-sectional view showing a diagrammatic structure of a principal part of the electronic device according to Embodiment 2. In FIG. 14, the substrate 11 composed of a semiconductor substrate made of silicon, a chemical semiconductor, etc. or the like is used. However, there may be the case where the substrate 11 is configured of other raw material such as glass, ceramics, sapphire, diamond and synthetic resins.

A primary layer (device separating layer) 12 configured of silicon nitride or the like is formed on the substrate 11. Also, a lower structure part 13A and an upper structure part 15A configuring an MEMS structural body such as an oscillator, a filter, an actuator and a sensor are formed in the MEMS structural body region 150 on the substrate 11. In the present embodiment, a resonator having a stator as the lower structure part 13A and a mover as the upper structure part 15A is exemplified. Accordingly, the lower structure part 13A and the upper structure part 15A are disposed separately and oppositely.

Also, a condenser in which a lower electrode 13B and an upper electrode 15B are disposed oppositely via an insulating membrane 14B is configured in the CMOS circuit part region 160 on the substrate 11. Furthermore, a CMOS transistor composed of an active layer 11A, impurities regions 11B and 11C, a gate insulating membrane 14C and a gate electrode 15C is formed in a surface layer part of the substrate 11.

Materials of the lower structure part 13A and the upper structure part 15A are not particularly limited so far as they are a conductor. It is desirable that each of the lower structure part 13A and the upper structure part 15A is configured of, for example, a conductive silicon membrane (doped polycrystalline silicon) because it can be carried out by a process the same as or similar to that in the gate electrode 15C configuring the CMOS transistor. The conductive silicon membrane is a raw material which configures a functional layer to be formed in a semiconductor manufacturing process and involves an advantage that the manufacturing process can be made common by forming it simultaneously with the functional layer in the semiconductor circuit while being not limited to the foregoing CMOS transistor.

Interlayer insulating layers 16 and 18 which are an insulating layer and which are composed of silicon oxide ($SiO_2$), in more detail, PSG (phosphorus-doped glass) or TEOS (CVD membrane formed using, as a raw material gas, tetraethyl ortho-silicate, etc.) or the like, wiring layers 17A, 17B, 17C and 17D composed of a conductor layer of aluminum, etc., a first covering layer 19A and wiring layers 19B, 19C, 19D and 19E are formed on the substrate 11. These wiring layers 19B, 19C, 19D and 19E are made to act as a conductive pattern for forming a prescribed circuit on the substrate 11. A passivation membrane 21 composed of silicon oxide ($SiO_2$), silicon nitride ($Si_3N_4$) or the like is laminated on the foregoing respective layers. This passivation membrane 21 is configured of a raw material having patterning (etching) selectivity against the interlayer insulating layers 16 and 18 and a sacrifice layer as described later. Furthermore, a second covering layer 22 is formed on the first covering layer 19A.

An opening part is provided in each of the interlayer insulating layers 16 and 18, and a cavity part C having the MEMS structural body disposed therein is configured by this opening part. The cavity part C is sealed upon being covered from an upper portion by a covering part configured of the first covering layer 19A and the second covering layer 22. Plural openings 19a communicating with the cavity part C are formed in the first covering layer 19A, and these openings 19a are closed when the second covering layer 22 is covered from an upper portion.

The first covering layer 19A is formed simultaneously with the wiring layers 19B, 19C, 19D and 19E. For example, a metallic layer is fabricated, and thereafter, the first covering layer 19A provided with the openings 19a is formed simultaneously with external shapes of the first covering layer 19A and the respective wiring layers by means of patterning. Here, there may be the case where the first covering layer 19A is configured of a laminated structure of plural layers similar to other wiring layers. For example, a first layer (lowermost layer) is configured of Ti or TiN in a thickness of from 1 to 1,000 nm, and preferably about 50 nm; a second layer (middle layer) is configured of an Al—Cu alloy layer in a thickness of from 10 to 10,000 nm, and preferably about 800 nm; and a third layer (uppermost layer) is configured of TiN in a thickness of from 1 to 1,000 nm, and preferably about 50 nm. In that case, by removing the first layer to be disposed just above the cavity part C, it is possible to easily carry out the release process.

Also, with respect to the configuration of the first covering layer 19A, as described in Embodiment 1 (see FIG. 9), a laminated structure in which a Ti layer, a TiN layer, an Al—Cu layer and a Ti—N layer are laminated in this order from the surface facing at the cavity part C; a laminated structure in which a TiN layer, an Al—Cu layer, a Ti layer and a TiN layer are laminated in this order from the surface facing at the cavity part C; a laminated structure in which a Ti layer, a TiN layer, an Al—Cu layer, a Ti layer and a TiN layer are laminated in this order from the surface facing at the cavity part C; a laminated structure in which a Ti layer, an Al—Cu layer and a TiN layer are laminated in this order from the surface facing at the cavity part C; and a laminated structure in which a TiN layer, an Al—Cu layer and a TiN layer are laminated in this order from the surface facing at the cavity part C can be adapted.

Also, in the openings 19a provided in the first covering layer 19A, the disposing configuration as described in Embodiment 1 can be applied, and therefore, its explanation is omitted.

Actually, after forming the interlayer insulating layers 16 and 18, the first covering layer 19A is formed; the interlayer insulating layers 16 and 18 are removed by etching by means of wet etching, dry etching or the like through the openings 19a of the first covering layer 19A; and thereafter, the cavity part C is formed by the release process for carrying out a treatment such as rinsing.

Also, the second covering layer 22 is fabricated on the first covering layer 19A under a reduced pressure by a vapor phase epitaxy method such as vacuum vapor deposition, sputtering and CVD methods. According to this, the openings 19a are closed in a state that the cavity part C is evacuated through the openings 19a. The second covering layer 22 is formed of an insulator such as silicon oxide and silicon nitride or a metal such as Al, Ti and W.

Next, the structure of the MEMS structural body region 150 is described with reference to the accompanying drawings. Also, FIG. 14 is made hereof by reference.

Figure 15:
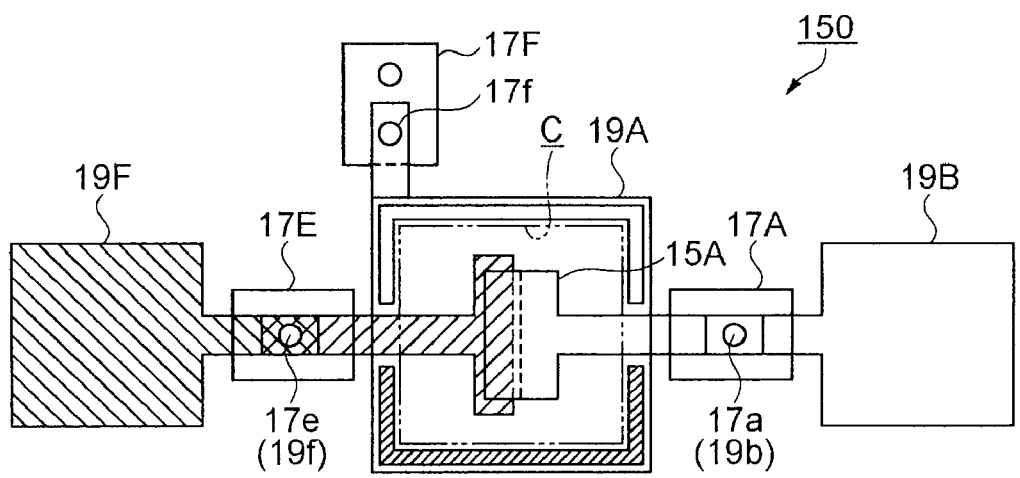
FIG. 15 is a planar layout view showing a diagrammatic structure of an MEMS structural body region according to Embodiment 2.

FIG. 15 is a planar layout view showing a diagrammatic structure of an MEMS structural body region according to the present embodiment. In FIG. 15, the lower structure part 13A and the upper structure part 15A are formed in a substantially central part of the MEMS structural body region 150. A part of the lower structure part 13A and a part of the upper structure part 15A intersect each other and are disposed separately (see FIG. 14).

An end part of the lower structure part 13A is connected to a wiring layer 19F via through-holes 17e and 19f and a wiring layer 17E. On the other hand, an end part of the upper structure part 15A is connected to the wiring layer 19B via through-holes 17a and 19b and a wiring layer 17A. Each of the wiring layers 17A and 19B is connected to one of wiring layers of a non-illustrated CMOS circuit part.

The first covering layer 19A is formed in an upper portion of a resonator composed of the lower structure part 13A and the upper structure part 15A so as to cover the cavity part C. One extended end of the first covering layer 19A is connected to an interlayer wiring layer 17F via a through-hole 17f and connected to a non-illustrated GND electrode of the CMOS circuit part. Also, lower surrounding walls 13a and 13b formed in the same process as in the lower structure part 13A are disposed in the surroundings of the cavity part C.

In the present embodiment, at least an oscillation circuit is formed in the inside of the CMOS circuit part; one side of an output part thereof is connected to the upper structure part 15A, with the other side being connected to the lower structure part 13A; and an oscillation signal is outputted to the upper structure part 15A and the lower structure part 13A from the oscillation circuit. Also, the MEMS structural body is a resonator composed of the lower structure part 13A and the upper structure part 15A. When a potential with the same polarity is applied, the upper structure part 15A and the lower structure part 13A repel each other, and when potentials with a different polarity are applied, the upper structure part 15A and the lower structure part 13A are attracted to each other, whereby the upper structure part 15A is oscillated in a cross-sectional direction. Accordingly, as to the electronic device 200 according to the present embodiment, an oscillator in which a resonator and an oscillation circuit are placed side by side on a semiconductor substrate is exemplified.

Subsequently, a manufacturing method of the electronic device according to Embodiment 2 is described. The manufacturing method as described below shows an embodiment of the case of manufacturing an electronic device having an MEMS structural body and a CMOS circuit part integrated therein. However, the present embodiment is not limited to such en embodiment but includes various functional devices in which the functional structural body is disposed in the cavity part.

Figure 16:
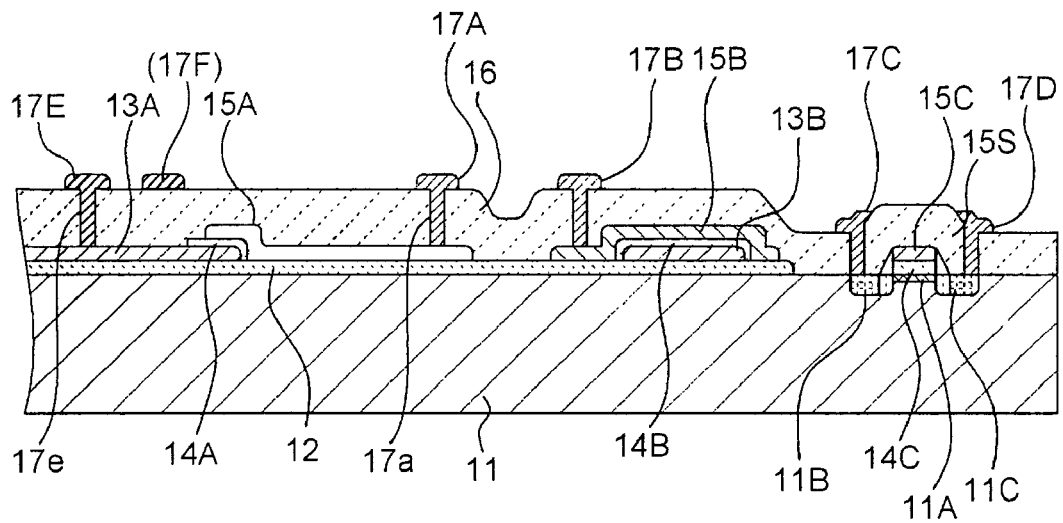
FIG. 16 is a diagrammatic process cross-sectional view showing a manufacturing process of an electronic device according to Embodiment 2.

FIGS. 16 to 19 are each a diagrammatic process cross-sectional view showing a manufacturing process of the electronic device according to the present embodiment. As shown in FIG. 16, the active layer 11A is first formed in the surface layer part of the substrate 11. Also, the primary layer 12 is formed on the substrate 11 by an epitaxy technology such as a sputtering method and a CVD method and a patterning technology; and the lower structure part 13A and the lower electrode 13B are formed simultaneously on this primary layer 12 by the same material by an epitaxy technology such as a sputtering method and a CVD method and a micro patterning technology.

Subsequently, a sacrifice layer 14A, the insulating membrane 14B and the gate insulating membrane 14C are formed simultaneously by the same material by a sputtering method or a CVD method. Thereafter, the upper structure part 15A, the upper electrode 15B and the gate electrode 15C are formed simultaneously by the same material by a sputtering method, a CVD method or the like. After forming the gate electrode 15C, impurities regions 11B and 11C are formed by self-alignment using the gate electrode 15C as a mask by an ion injection method or the like.

The foregoing are a functional structural body forming process for forming a functional structural body (MEMS structural body) along with the sacrifice layer 14A and a process for forming a CMOS transistor.

Next, an interlayer insulating layer 16 is formed on the foregoing structure by a sputtering method, a CVD method or the like, and a group of through-holes including the through-holes 17a and 17e is formed by means of patterning. Thereafter, an appropriate wiring pattern is formed on the interlayer insulating layer 16 by a vapor deposition method, a sputtering method, a CVD method or the like; and the wiring layer 17E conductively connected to the lower structure part 13A via the through-hole 17e and the wiring layer 17A conductively connected to the upper structure part 15A via the through-hole 17a are formed.

Furthermore, a wiring layer 17B conductively connected to the upper electrode 15B via a through-hole, wiring layers 17C and 17D conductively connected to the impurities regions 11B and 11C via a through-hole, and the like are formed. Also, an extraction wiring structure from an MEMS structural body, a condenser or a CMOS transistor is formed by these wiring layers including non-illustrated other wiring layers.

Figure 17:
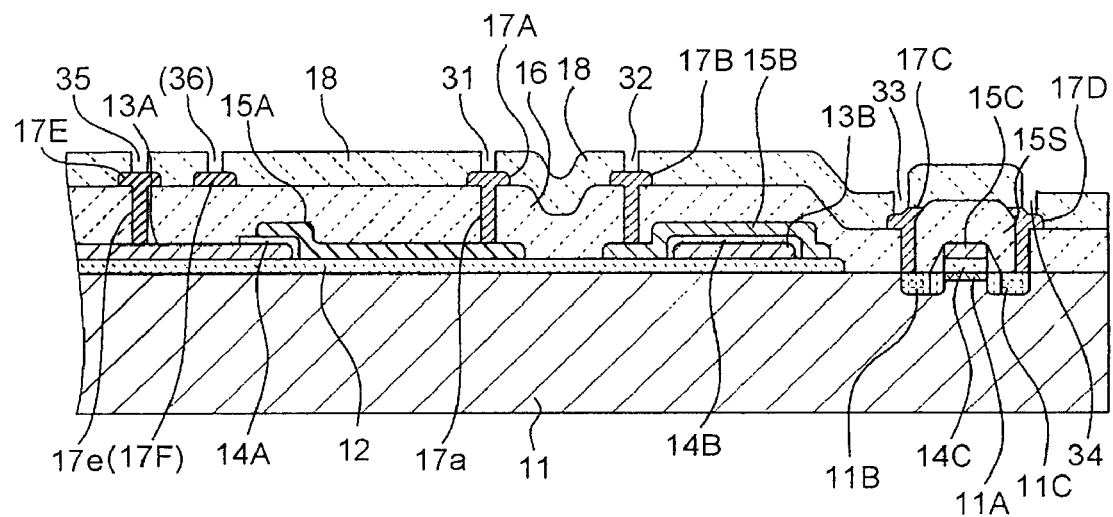
FIG. 17 is a diagrammatic process cross-sectional view showing a manufacturing process of an electronic device according to Embodiment 2.

Next, as shown in FIG. 17, the interlayer insulating layer 18 is formed on the periphery including an upper part of the MEMS structure and an upper part of the CMOS transistor by a sputtering method, a CVD method or the like (interlayer insulating forming process). On that occasion, through-holes 31 to 36 are formed by means of patterning.

Figure 18:
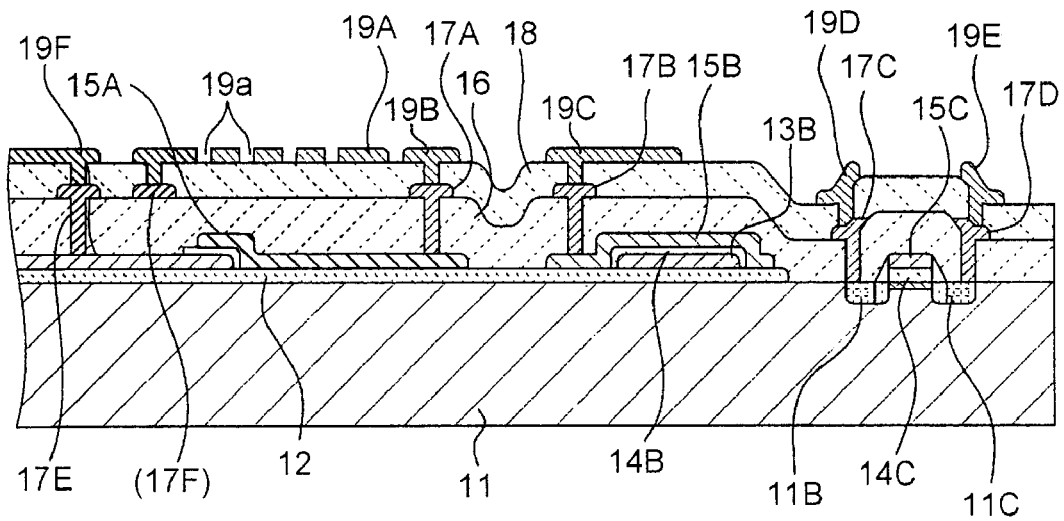
FIG. 18 is a diagrammatic process cross-sectional view showing a manufacturing process of an electronic device according to Embodiment 2.

Next, as shown in FIG. 18, the first covering layer 19A and the wiring layers 19B, 19C, 19D, 19E and 19F are formed on the interlayer insulating layer 18 by a vapor deposition method, a sputtering method, a CVD method or the like. As to the MEMS structural body, a wiring layer for connecting each of the wiring layer 19F connected to the lower structure part 13A and the wiring layer 19B connected to the upper structure part 15A to the foregoing CMOS circuit part (CMOS transistor) is formed (wiring layer forming step). The openings 19a are formed in the first covering layer 19A along with an external shape pattern or a wiring pattern by means of a fine patterning technology.

Figure 19:
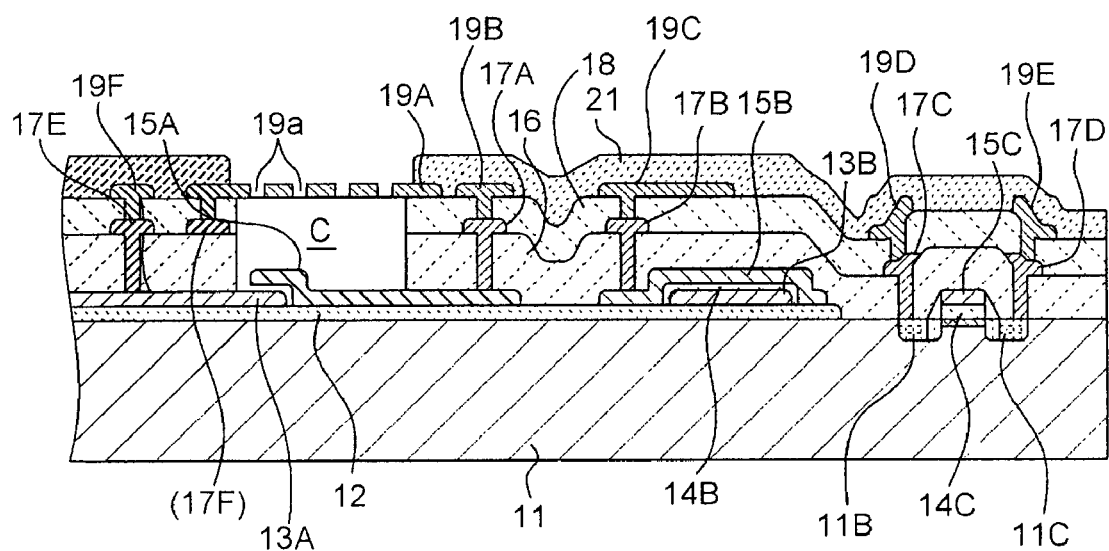
FIG. 19 is a diagrammatic process cross-sectional view showing a manufacturing process of an electronic device according to Embodiment 2.

Thereafter, as shown in FIG. 19, the passivation membrane 21 composed of silicon nitride or the like is formed on the surfaces of the interlayer insulating layer 18 and the wiring layers 19B, 19C, 19D, 19E and 19F by a sputtering method, a CVD method or the like, thereby covering a region including the periphery of the first covering layer 19A (passivation membrane forming process).

Subsequently, the interlayer insulating layers and 16 and the sacrifice layer 14A existing beneath the openings 19a are removed through the openings 19a by a hydrofluoric acid aqueous solution, a buffer hydrofluoric acid aqueous solution, a hydrofluoric acid gas or the like (release process). According to this, the cavity part C is formed. Thereafter, the inner surface of the cavity part C is rinsed by means of water washing or the like.

Next, as shown in FIG. 14, the second covering layer 22 is fabricated in the evacuated space (reaction chamber) by a vapor deposition method, a sputtering method, a CVD method or the like. According to this, the openings 19a are closed in a state that the inside of the cavity part C is evacuated, thereby achieving sealing (second covering layer forming process).

Accordingly, in the electronic device 200 according to Embodiment 2, it is possible to achieve miniaturization by configuring it in such a manner that the functional structural body (functional structural body region 150) and the CMOS circuit part (CMOS circuit part region 160) are placed side by side on the substrate 11. Namely, it is possible to realize miniaturization of an oscillator. Also, in view of the matter that the first covering layer 19A for covering the cavity part C from an upper portion includes a corrosion-resistant layer, even when the release process is carried out over a long period of time, the corrosion-resistant layer remains without hindrance because it has high etching resistance. Therefore, the closing treatment by the second covering layer 22 can be surely carried out, and an oscillator with high reliability can be provided.

Furthermore, since in each of the functional structural body and the CMOS circuit part, the interlayer insulating layer and the wiring layer can be partially made common to each other, it is possible to efficiently achieve the manufacture using a semiconductor manufacturing process. Accordingly, not only the manufacturing yield can be secured, but the manufacturing costs can be reduced.

The electronic device and manufacturing method thereof according to some aspects of the invention are not limited only to the above-referenced illustrated embodiments, and as a matter of course, various changes and modifications can be made therein within the range not deviating from the gist of the invention.

For example, in the foregoing embodiments, the resonator or oscillator is configured while carrying out a semiconductor manufacturing process the same as the CMOS process on the semiconductor substrate. However, the embodiments of the invention can also be adapted with an MEMS device (MEMS structural body 3X) as a functional structural body such as an actuator and a high-frequency filter. Besides, the embodiments of the invention can be applied to ones provided with a functional structural body of every kind other than MEMS structural bodies such as a quartz oscillator, an acceleration sensor and a gyroscope.

Also, in the foregoing embodiments, the semiconductor device having a functional structural body and a semiconductor integrated circuit integrated therein is configured. However, substrates other than the semiconductor substrate may be used, or ones in which other electronic circuit than the semiconductor circuit is connected to the functional structural body may be used.

The entire disclosure of Japanese Patent Application No. 2008-027304, filed Feb. 7, 2008 is expressly incorporated by reference herein.

What is claimed is:

1. An electronic device comprising a substrate having a functional structural body provided in an inside of a cavity part and a CMOS circuit part placed side by side on the substrate, wherein a covering structure for defining the cavity part is provided with a side wall; and a first covering layer covering an upper portion of the cavity part and having an opening penetrating through the cavity part and composed of a laminated structure including a corrosion-resistant layer; and a second covering layer for closing the opening.

2. The electronic device according to claim 1, wherein the corrosion-resistant layer is configured by a part of the first covering layer in a thickness direction thereof.

3. The electronic device according to claim 1, wherein the corrosion-resistant layer is composed of TiN, Ti, W, Au, Pt or an alloy thereof.

4. The electronic device according to claim 1, wherein the corrosion-resistant layer is configured of a layer provided in an uppermost layer of the first covering layer.

5. The electronic device according to claim 1, wherein the corrosion-resistant layer is configured of a layer provided in a lowermost layer of the first covering layer.

6. The electronic device according to claim 1, wherein the corrosion-resistant layer is configured of layers provided in an uppermost layer and a lowermost layer of the first covering layer.

7. The electronic device according to claim 1, wherein the first covering layer is of a laminated structure in which a Ti layer, a TiN layer, an Al—Cu layer and a TiN layer are laminated in this order from a surface facing at the cavity part.

8. The electronic device according to claim 1, wherein the first covering layer is of a laminated structure in which a TiN layer, an Al—Cu layer, a Ti layer and a TiN layer are laminated in this order from a surface facing at the cavity part.

9. The electronic device according to claim 1, wherein the first covering layer is of a laminated structure in which a Ti layer, a TiN layer, an Al—Cu layer, a Ti layer and a TiN layer are laminated in this order from a surface facing at the cavity part.

10. The electronic device according to claim 1, wherein the first covering layer is of a laminated structure in which a Ti layer, an Al—Cu layer and a TiN layer are laminated in this order from a surface facing at the cavity part.

11. The electronic device according to claim 1, wherein the first covering layer is of a laminated structure in which a TiN layer, an Al—Cu layer and a TiN layer are laminated in this order from a surface facing at the cavity part.

12. The electronic device according to claim 1, wherein the side wall further includes an interlayer insulating layer and a wiring layer, the interlayer insulating layer and the wiring layer being a part of interlayer insulating layers and wiring layers of the functional structural body and the CMOS circuit part.

* * * * *